United States Patent
Zi et al.

(10) Patent No.: US 12,210,283 B2
(45) Date of Patent: *Jan. 28, 2025

(54) EUV PHOTORESIST WITH LOW-ACTIVATION-ENERGY LIGANDS OR HIGH-DEVELOPER-SOLUBILITY LIGANDS

(71) Applicant: Taiwan Semiconductor Manufacturing Co., Ltd., Hsin-Chu (TW)

(72) Inventors: An-Ren Zi, Hsinchu (TW); Chen-Yu Liu, Kaohsiung (TW); Ching-Yu Chang, Yilang County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/321,310

(22) Filed: May 22, 2023

(65) Prior Publication Data

US 2023/0305396 A1    Sep. 28, 2023

Related U.S. Application Data

(63) Continuation of application No. 16/681,610, filed on Nov. 12, 2019, now Pat. No. 11,681,221.

(60) Provisional application No. 62/892,666, filed on Aug. 28, 2019.

(51) Int. Cl.
| | |
|---|---|
| G03F 7/004 | (2006.01) |
| G03F 7/16 | (2006.01) |
| G03F 7/20 | (2006.01) |
| G03F 7/32 | (2006.01) |
| H01L 21/027 | (2006.01) |

(52) U.S. Cl.
CPC ............. *G03F 7/0046* (2013.01); *G03F 7/16* (2013.01); *G03F 7/2004* (2013.01); *G03F 7/32* (2013.01); *H01L 21/0274* (2013.01)

(58) Field of Classification Search
None
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,857,684 B2 | 1/2018 | Lin et al. | |
| 9,859,206 B2 | 1/2018 | Yu et al. | |
| 9,875,892 B2 | 1/2018 | Chang et al. | |
| 10,381,481 B1 | 8/2019 | Zi et al. | |
| 11,681,221 B2* | 6/2023 | Zi | G03F 7/0046 |
| | | | 430/313 |
| 2012/0315451 A1* | 12/2012 | Malik | C08F 4/12 |
| | | | 428/209 |
| 2015/0056542 A1 | 2/2015 | Meyers et al. | |
| 2017/0168398 A1 | 6/2017 | Zi et al. | |
| 2017/0271150 A1 | 9/2017 | Chang et al. | |
| 2018/0315617 A1 | 11/2018 | Zi et al. | |
| 2018/0373143 A1 | 12/2018 | Robinson et al. | |
| 2019/0310551 A1 | 10/2019 | Minegishi et al. | |

FOREIGN PATENT DOCUMENTS

| | | |
|---|---|---|
| KR | 20180054509 A | 5/2018 |
| KR | 201900160618 A | 1/2019 |
| KR | 20190074004 A | 6/2019 |
| KR | 2020079731 A | 7/2020 |
| TW | 201825505 A | 7/2018 |
| TW | 201923451 A | 6/2019 |
| WO | WO2019021975 A1 | 2/2019 |

* cited by examiner

*Primary Examiner* — Daborah Chacko-Davis
(74) *Attorney, Agent, or Firm* — HAYNES AND BOONE, LLP

(57) ABSTRACT

A photoresist includes a core group that contains metal, and one or more first ligands or one or more second ligands attached to the core group. The first ligands each have a following structure:

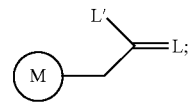

The second ligands each have a following structure:

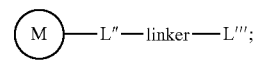

M represents the core group. L' represents a chemical that includes 0-2 carbon atoms saturated by Hydrogen (H) or Fluorine (F). L represents a chemical that includes 1-6 carbon atoms saturated by H or F. L" represents a chemical that includes 1-6 carbon atoms saturated by H. L'" represents a chemical that includes 1-6 carbon atoms saturated by H or F. Linker represents a chemical that links L" and L'" together.

20 Claims, 12 Drawing Sheets

Low-activation-energy ligands

EUV PHOTORESIST WITH
LOW-ACTIVATION-ENERGY LIGANDS OR
HIGH-DEVELOPER-SOLUBILITY LIGANDS

PRIORITY DATA

The present application is a continuation of patent application Ser. No. 16/681,610 filed on Nov. 12, 2019, entitled "EUV Photoresist With Low-Activation-Energy Ligands or High-Developer-Solubility Ligands The present application," which is a utility patent application of U.S. Provisional Patent Application No. 62/892,666, filed on Aug. 28, 2019, entitled "EUV Photoresist With Low-Activation-Energy Ligands Or High-Developer-Solubility Ligands", the contents of which are hereby incorporated by reference in their respective entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

For these advances to be realized, similar developments in IC processing and manufacturing are needed. For example, the need to perform higher resolution lithography processes grows. One lithography technique is extreme ultraviolet (EUV) lithography. The EUV lithography employs scanners using light in the extreme ultraviolet region, having a wavelength of about 1-100 nanometers (nm). Some EUV scanners provide 4× reduction projection printing, similar to some optical scanners, except that the EUV scanners use reflective rather than refractive optics, i.e., mirrors instead of lenses. EUV scanners provide the desired pattern on an absorption layer ("EUV" mask absorber) formed on a reflective mask.

However, while conventional EUV lithography has been generally adequate for its intended purposes, it has not been entirely satisfactory in every aspect. For example, conventional EUV photoresist materials have not been optimized for photon absorption and line-width-roughness (LWR).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
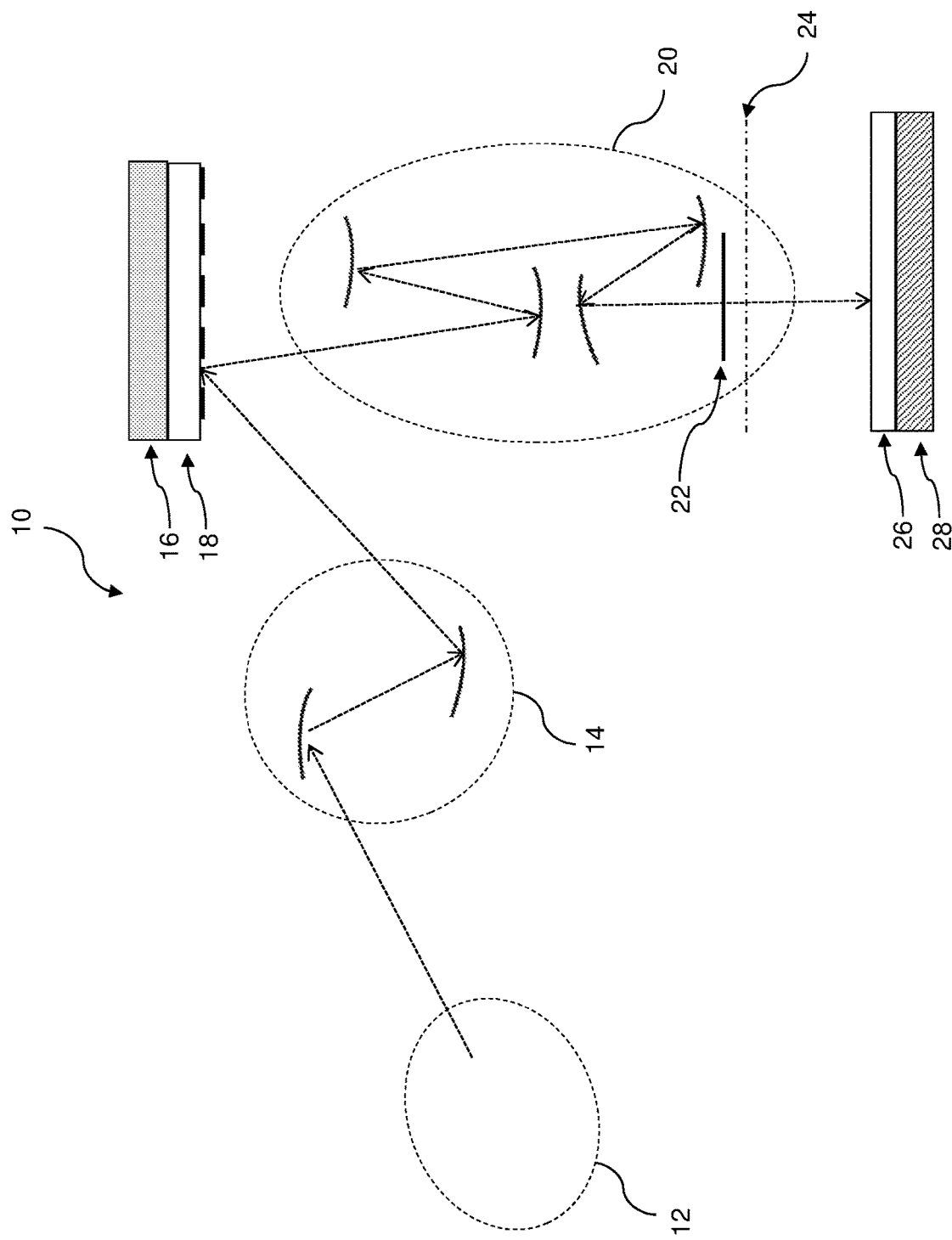
FIG. 1 is a schematic view of a lithography system constructed in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

Extreme ultraviolet (EUV) lithography has become widely used due to its ability to achieve small semiconductor device sizes. However, conventional EUV photoresist may still need improvements. For example, photoresist in EUV lithography may still have weak photo absorption compared to the photoresist used for non-EUV lithography. As another example, EUV lithography is typically associated with a tradeoff between sensitivity and line-width-roughness (LWR). Therefore, conventional EUV photoresist design may need to be improved.

The present disclosure pertains to an EUV photoresist with novel ligand structures. For example, the ligands may have lower activation energy compared to conventional EUV photoresist. As another example, the ligands may have higher developed solubility than conventional EUV photoresist. These various aspects of the present disclosure are discussed in more detail below. First, a EUV lithography system will be discussed below with reference to FIGS. 1-2. Next, the details of the various additives are described according to embodiments of the present disclosure with reference to FIGS. 3-12.

FIG. 1 is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 12 to generate EUV light, such as EUV light having a wavelength ranging between about 1 nm and about 100 nm. In one particular example, the radiation source 12 generates a EUV light with a wavelength centered at about 13.5 nm. Accordingly, the radiation source 12 is also referred to as EUV radiation source 12.

The lithography system 10 also employs an illuminator 14. In various embodiments, the illuminator 14 includes various refractive optic components, such as a single lens or a lens system having multiple lenses (zone plates) or alternatively reflective optics (for EUV lithography system), such as a single mirror or a mirror system having multiple mirrors in order to direct light from the radiation source 12 onto a mask stage 16, particularly to a mask 18 secured on the mask stage 16. In the present embodiment where the radiation source 12 generates light in the EUV wavelength range, the illuminator 14 employs reflective optics. In some embodiments, the illuminator 14 includes a dipole illumination component.

In some embodiments, the illuminator 14 is operable to configure the mirrors to provide a proper illumination to the mask 18. In one example, the mirrors of the illuminator 14 are switchable to reflect EUV light to different illumination positions. In some embodiment, a stage prior to the illuminator 14 may additionally include other switchable mirrors that are controllable to direct the EUV light to different illumination positions with the mirrors of the illuminator 14. In some embodiments, the illuminator 14 is configured to provide an on-axis illumination (ONI) to the mask 18. In an example, a disk illuminator 14 with partial coherence a being at most 0.3 is employed. In some other embodiments, the illuminator 14 is configured to provide an off-axis illumination (OAI) to the mask 18. In an example, the illuminator 14 is a dipole illuminator. The dipole illuminator has a partial coherence a of at most 0.3 in some embodiments.

The lithography system 10 also includes a mask stage 16 configured to secure a mask 18. In some embodiments, the mask stage 16 includes an electrostatic chuck (e-chuck) to secure the mask 18. This is because gas molecules absorb EUV light, and the lithography system for the EUV lithography patterning is maintained in a vacuum environment to avoid the EUV intensity loss. In the disclosure, the terms of mask, photomask, and reticle are used interchangeably to refer to the same item.

In the present embodiment, the lithography system 10 is a EUV lithography system, and the mask 18 is a reflective mask. One exemplary structure of the mask 18 is provided for illustration. The mask 18 includes a substrate with a suitable material, such as a low thermal expansion material (LTEM) or fused quartz. In various examples, the LTEM includes $TiO_2$ doped $SiO_2$, or other suitable materials with low thermal expansion. In some embodiments, the LTEM includes 5%-20% by weight $TiO_2$ and has a thermal coefficient of expansion lower than about $1.0 \times 10^{-6}/°$ C. For example, in some embodiments, the $TiO_2$ doped $SiO_2$ material of the LTEM has a coefficient thermal expansion such that it varies by less than 60 parts-per-billion for every 1 degree Celsius of temperature change. Of course, other suitable materials having thermal coefficient of expansion that is equal to or less than $TiO_2$ doped $SiO_2$ may also be used.

The mask 18 also includes a reflective ML deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 18 may further include a capping layer, such as ruthenium (Ru), disposed on the ML for protection. The mask 18 further includes an absorption layer deposited over the ML. The absorption layer is patterned to define a layer of an integrated circuit (IC). Alternatively, another reflective layer may be deposited over the ML and is patterned to define a layer of an integrated circuit, thereby forming a EUV phase shift mask.

The lithography system 10 also includes a projection optics module (or projection optics box (POB) 20 for imaging the pattern of the mask 18 on to a semiconductor substrate (as an example of the target 26) secured on a substrate stage 28 of the lithography system 10. The POB 20 has refractive optics (such as for UV lithography system) or alternatively reflective optics (such as for EUV lithography system) in various embodiments. The light directed from the mask 18, diffracted into various diffraction orders and carrying the image of the pattern defined on the mask, is collected by the POB 20. The POB 20 may include a magnification of less than one (thereby the size of the "image" on a target (such as target 26 discussed below) is smaller than the size of the corresponding "object" on the mask). The illuminator 14 and the POB 20 are collectively referred to as an optical module of the lithography system 10.

The lithography system 10 also includes a pupil phase modulator 22 to modulate optical phase of the light directed from the mask 18 so that the light has a phase distribution on a projection pupil plane 24. In the optical module, there is a plane with field distribution corresponding to Fourier Transform of the object (the mask 18 in the present case). This plane is referred to as projection pupil plane. The pupil phase modulator 22 provides a mechanism to modulate the optical phase of the light on the projection pupil plane 24. In some embodiments, the pupil phase modulator 22 includes a mechanism to tune the reflective mirrors of the POB 20 for phase modulation. For example, the mirrors of the POB 20 are switchable and are controlled to reflect the EUV light, thereby modulating the phase of the light through the POB 20.

In some embodiments, the pupil phase modulator 22 utilizes a pupil filter placed on the projection pupil plane. A pupil filter filters out specific spatial frequency components of the EUV light from the mask 18. Particularly, the pupil filter is a phase pupil filter that functions to modulate phase distribution of the light directed through the POB 20. However, utilizing a phase pupil filter is limited in some lithography system (such as an EUV lithography system) since all materials absorb EUV light.

As discussed above, the lithography system 10 also includes the substrate stage 28 to secure a target 26 to be patterned, such as a semiconductor substrate. In the present embodiment, the semiconductor substrate is a semiconductor wafer, such as a silicon wafer or other type of wafer. The target 26 (such as substrate) is coated with the resist layer sensitive to the radiation beam, such as EUV light in the present embodiment. Various components including those described above are integrated together and are operable to perform lithography exposing processes. The lithography system 10 may further include other modules or may be integrated with (or be coupled with) other modules.

The mask 18 and the method making the same are further described in accordance with some embodiments. In some embodiments, the mask fabrication process includes two operations: a blank mask fabrication process and a mask patterning process. During the blank mask fabrication process, a blank mask is formed by deposing suitable layers (e.g., reflective multiple layers) on a suitable substrate. The blank mask is then patterned during the mask patterning process to achieve a desired design of a layer of an integrated circuit (IC). The patterned mask is then used to transfer circuit patterns (e.g., the design of a layer of an IC) onto a semiconductor wafer. The patterns can be transferred over and over onto multiple wafers through various lithography processes. A set of masks is used to construct a complete IC.

The mask 18 includes a suitable structure, such as a binary intensity mask (BIM) and phase-shifting mask (PSM) in various embodiments. An example BIM includes absorptive regions (also referred to as opaque regions) and reflective regions, patterned to define an IC pattern to be transferred to the target. In the opaque regions, an absorber is present, and an incident light is almost fully absorbed by the absorber. In the reflective regions, the absorber is removed and the incident light is diffracted by a multilayer (ML). The PSM can be an attenuated PSM (AttPSM) or an alternating PSM (AltPSM). An exemplary PSM includes a first reflective layer (such as a reflective ML) and a second reflective layer patterned according to an IC pattern. In some examples, an AttPSM usually has a reflectivity of 2%-15% from its absorber, while an AltPSM usually has a reflectivity of larger than 50% from its absorber.

Figure 2:
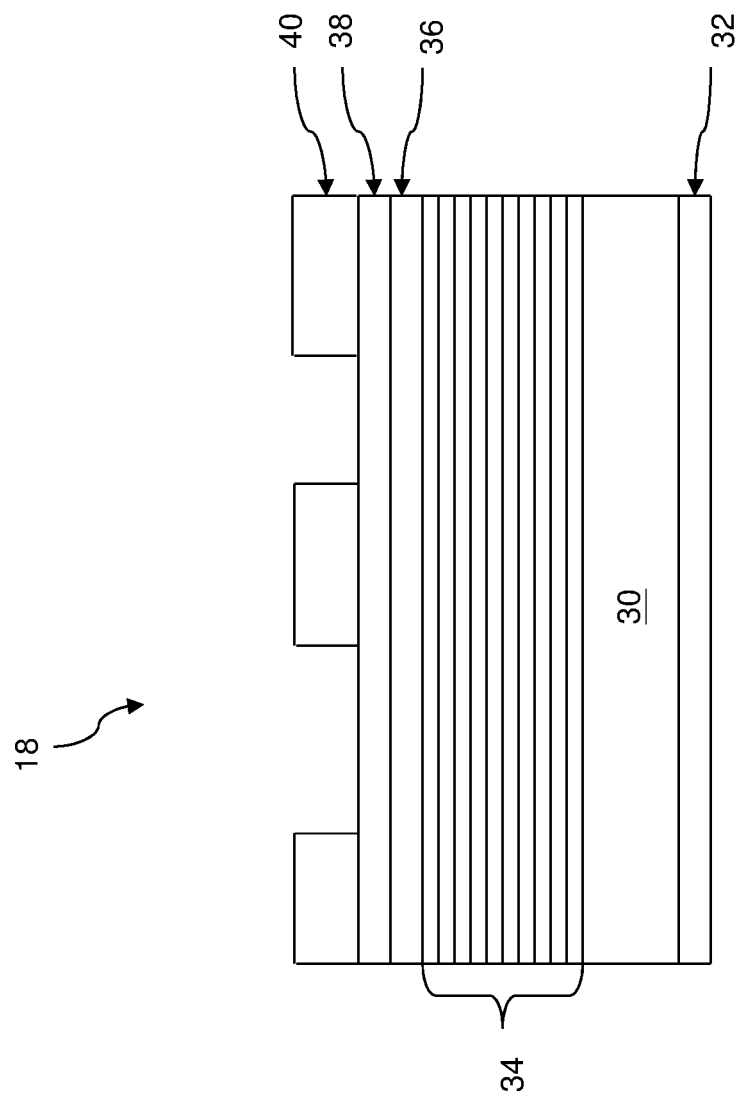
FIG. 2 is a sectional view of an EUV mask constructed in accordance with some embodiments of the present disclosure.

One example of the mask 18 is shown in FIG. 2. The mask 18 in the illustrated embodiment is a EUV mask, and includes a substrate 30 made of a LTEM. The LTEM material may include $TiO_2$ doped $SiO_2$, and/or other low thermal expansion materials known in the art. In some embodiments, a conductive layer 32 is additionally disposed under on the backside of the LTEM substrate 30 for the electrostatic chucking purpose. In one example, the conductive layer 32 includes chromium nitride (CrN). In other embodiments, other suitable compositions are possible, such as a tantalum-containing material.

The EUV mask 18 includes a reflective multilayer structure 34 disposed over the LTEM substrate 30. The reflective multilayer structure 34 may be selected such that it provides a high reflectivity to a selected radiation type/wavelength. The reflective multilayer structure 34 includes a plurality of film pairs, such as Mo/Si film pairs (e.g., a layer of molybdenum above or below a layer of silicon in each film pair). Alternatively, the reflective multilayer structure 34 may include Mo/Be film pairs, or any materials with refractive index difference being highly reflective at EUV wavelengths.

Still referring to FIG. 2, the EUV mask 18 also includes a capping layer 36 disposed over the reflective multilayer structure 34 to prevent oxidation of the ML. In one embodiment, the capping layer 36 includes silicon with a thickness ranging from about 4 nm to about 7 nm. The EUV mask 18 may further include a buffer layer 38 disposed above the capping layer 36 to serve as an etching-stop layer in a patterning or repairing process of an absorption layer, which will be described later. The buffer layer 38 has different etching characteristics from the absorption layer disposed thereabove. The buffer layer 38 includes ruthenium (Ru), Ru compounds such as RuB, RuSi, chromium (Cr), chromium oxide, and chromium nitride in various examples.

The EUV mask 18 also includes an absorber layer 40 (also referred to as an absorption layer) formed over the buffer layer 38. In some embodiments, the absorber layer 40 absorbs the EUV radiation directed onto the mask. In various embodiments, the absorber layer may be made of tantalum boron nitride (TaBN), tantalum boron oxide (TaBO), or chromium (Cr), Radium (Ra), or a suitable oxide or nitride (or alloy) of one or more of the following materials: Actium, Radium, Tellurium, Zinc, Copper, and Aluminum.

Figure 3:
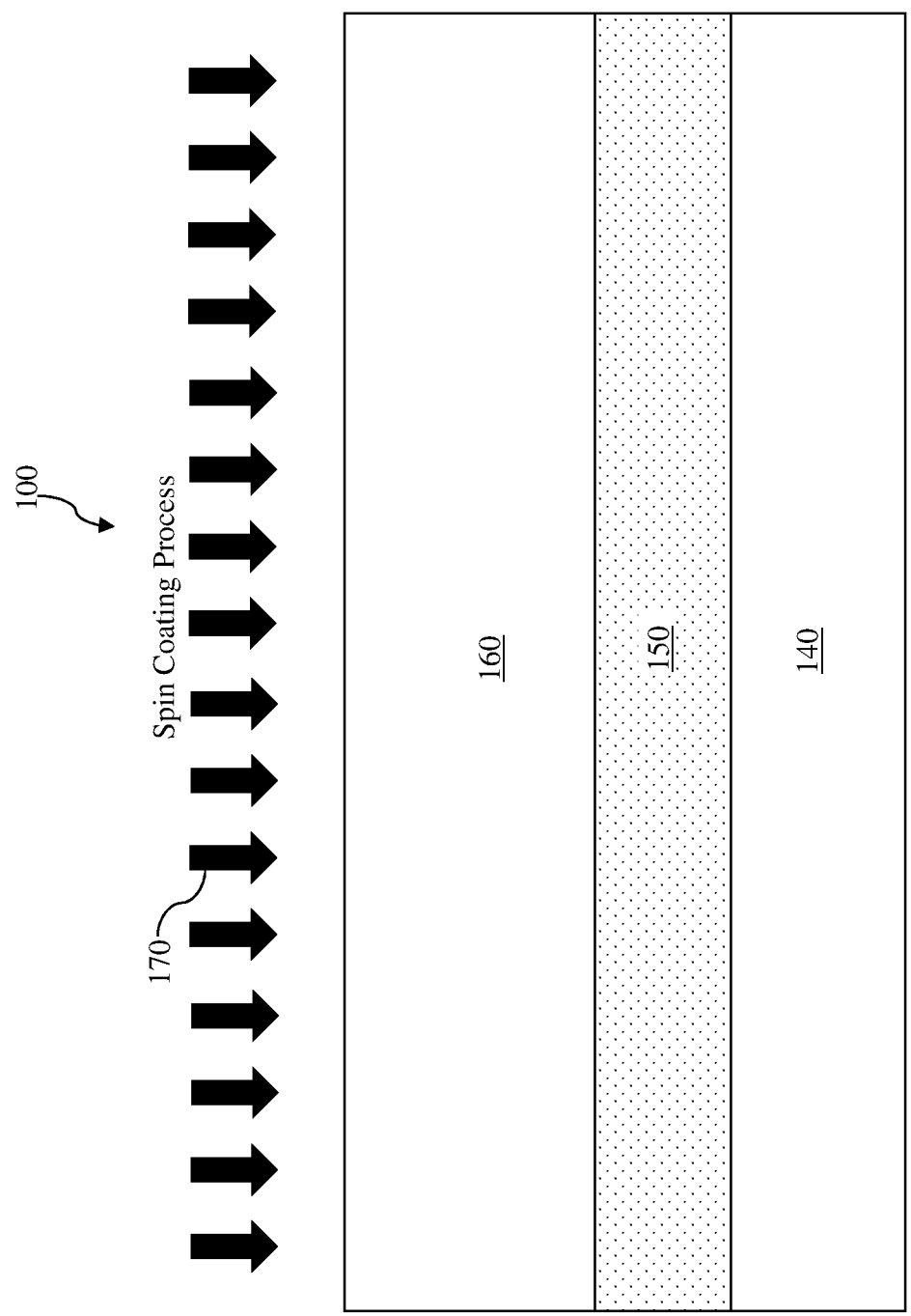
FIG. 3 is a diagrammatic fragmentary cross-sectional side view of a semiconductor device at a stage of fabrication in accordance with some embodiments of the present disclosure.
Figure 10:
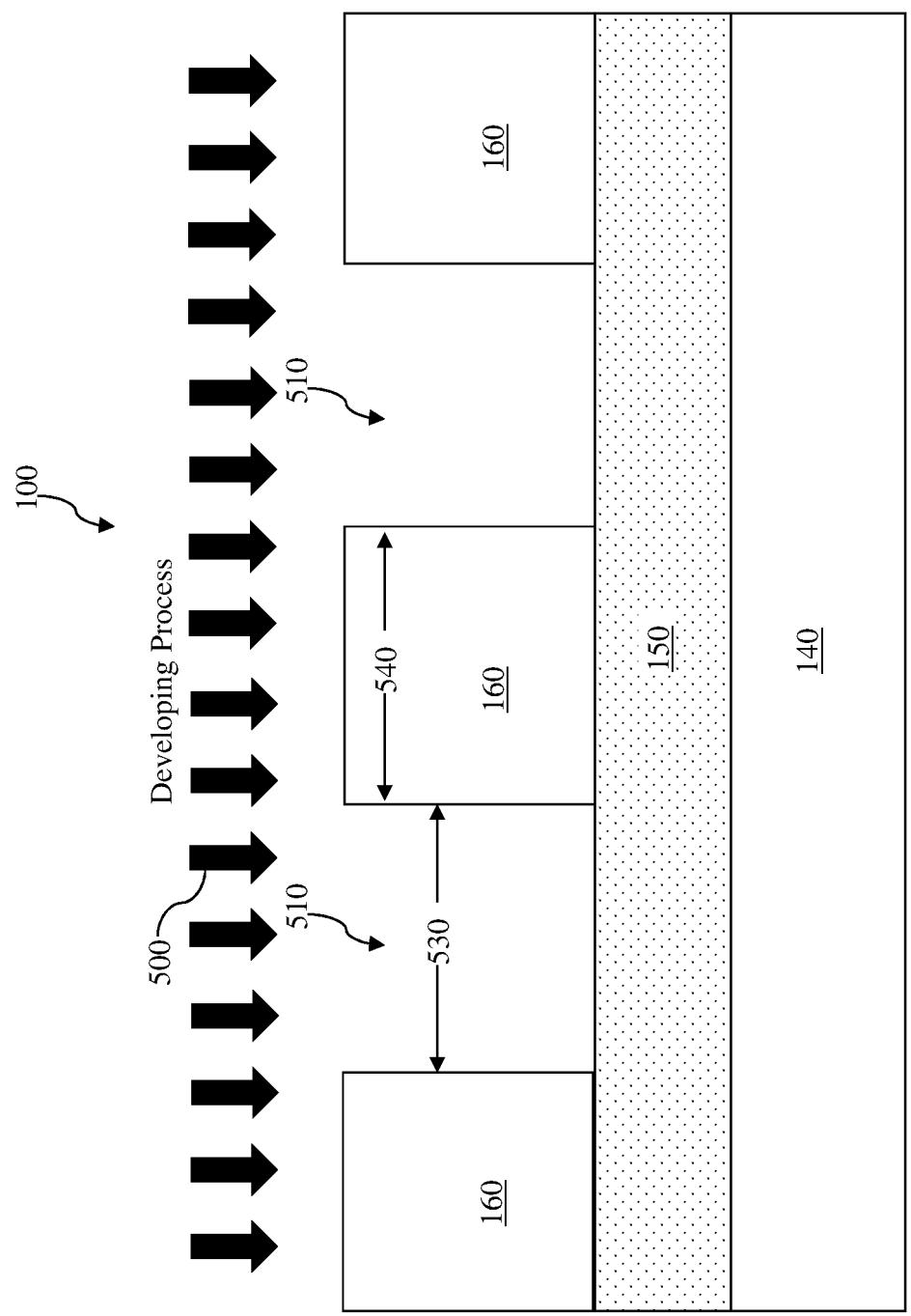
FIGS. 10-11 are diagrammatic fragmentary cross-sectional side views of a semiconductor device at various stages of fabrication in accordance with some embodiments of the present disclosure.
Figure 11:
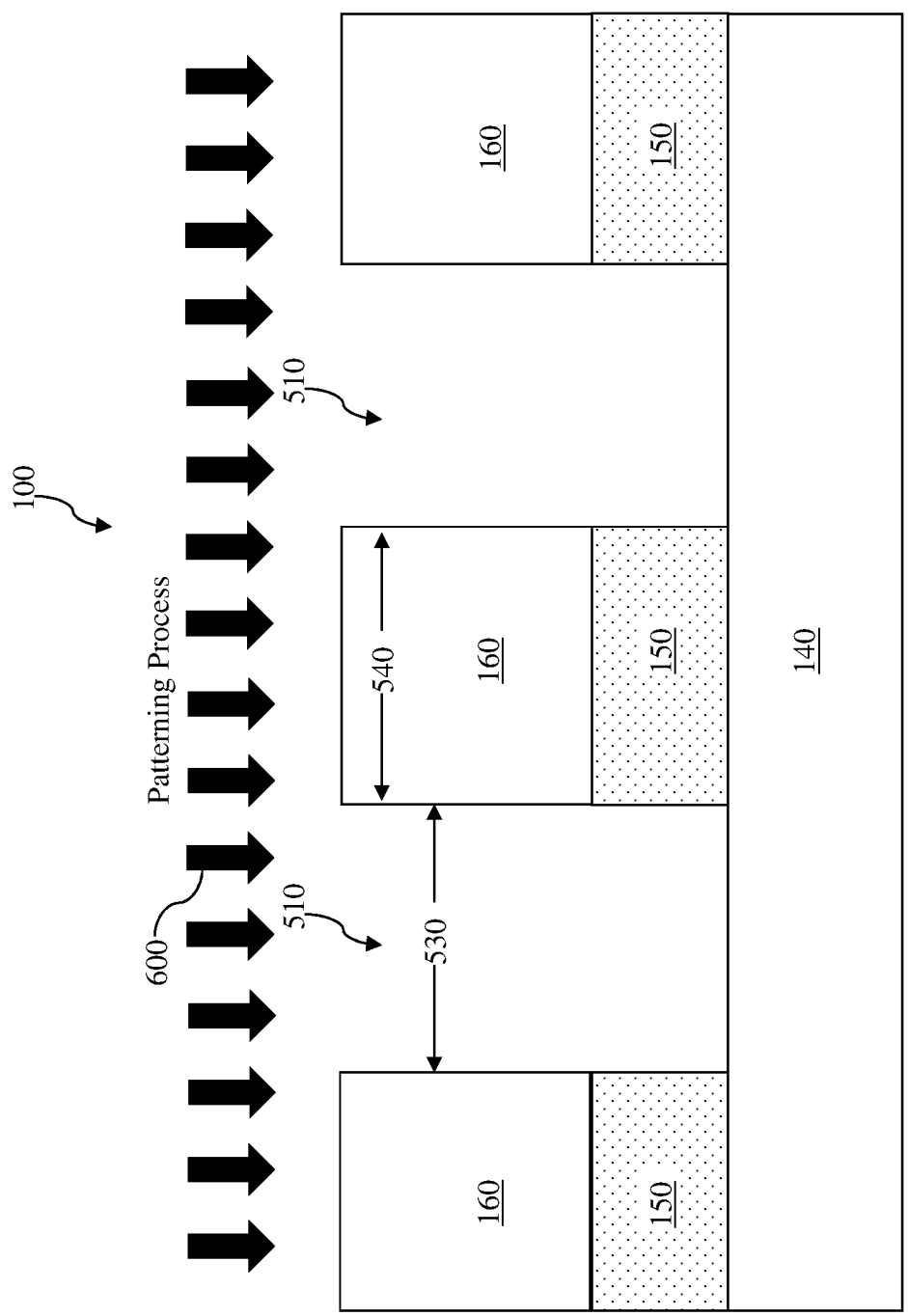

FIGS. 3 and 10-11 illustrate simplified diagrammatic fragmentary cross-sectional side views of a semiconductor device 100 at various stages of fabrication according to embodiments of the present disclosure. Referring to FIG. 3, a semiconductor device 100 includes a substrate 140. In some embodiments, the substrate 140 is a silicon substrate doped with a p-type dopant such as boron (for example a p-type substrate). Alternatively, the substrate 140 could be another suitable semiconductor material. For example, the substrate 140 may be a silicon substrate that is doped with an n-type dopant such as phosphorous or arsenic (an n-type substrate). The substrate 140 could include other elementary semiconductors such as germanium and diamond. The substrate 140 could optionally include a compound semiconductor and/or an alloy semiconductor. Further, the substrate 140 could include an epitaxial layer (epi layer), may be strained for performance enhancement, and may include a silicon-on-insulator (SOI) structure.

In some embodiments, the substrate 140 is substantially conductive or semi-conductive. The electrical resistance may be less than about 103 ohm-meter. In some embodiments, the substrate 140 contains metal, metal alloy, or metal nitride/sulfide/selenide/oxide/silicide with the formula $MX_a$, where M is a metal, and X is N, S, Se, O, Si, and where "a" is in a range from about 0.4 to 2.5. For example, the substrate 140 may contain Ti, Al, Co, Ru, TiN, $WN_2$, or TaN.

In some other embodiments, the substrate 140 contains a dielectric material with a dielectric constant in a range from about 1 to about 140. In some other embodiments, the substrate 140 contains Si, metal oxide, or metal nitride, where the formula is $MX_b$, wherein M is a metal or Si, and X is N or O, and wherein "b" is in a range from about 0.4 to 2.5. For example, the substrate 140 may contain silicon oxide, silicon nitride, aluminum oxide, hafnium oxide, or lanthanum oxide.

A material layer 150 is formed over the substrate 140. The material layer 150 can be patterned via a lithography process and as such may also be referred to as a patternable layer. In an embodiment, the material layer 150 includes a dielectric material, such as silicon oxide or silicon nitride. In another embodiment, the material layer 150 includes metal. In yet another embodiment, the material layer 150 includes a semiconductor material.

In some embodiments, the material layer 150 has different optical properties than photoresist. For example, the material layer 150 has a different n, k, or T value from photoresist. In some embodiments, the material layer 150 comprises at least one of different polymer structure, acid labile molecule, PAG (photo acid generator) loading, quencher loading, chromophore, cross linker, or solvent, which lead to different n value to photoresist. In some embodiments, the material layer 150 and photoresist have different etching resistance. In some embodiments, the material layer 150 contains an etching resistant molecule. The molecule includes low onishi number structure, double bond, triple bond, silicon, silicon nitride, Ti, TiN, Al, aluminum oxide, SiON, or combinations thereof. It is understood that the substrate 140 and the material layer 150 may each include additional suitable material compositions in other embodiments.

A photoresist layer 160 is formed over the substrate 140 (specifically, over the material layer 150). The photoresist layer 160 may be formed by a spin coating process 170, for example. The photoresist layer 160 contains a metallic photoresist material configured for EUV lithography. For example, the metallic photoresist material is sensitive to a radiation source such as the radiation source 12 discussed above in association with FIG. 1. The metal component in the metallic photoresist material can enhance EUV sensitivity.

The photoresist layer 160 may have a single-layer structure or a multi-layer structure. In one embodiment, the photoresist layer 160 includes a metallic resist material that polymerizes (and/or crosslinks) and subsequently becomes insoluble in a developer after the metallic resist material is exposed to a radiation source (e.g., the radiation source 12). In some embodiments, the developer may include: PGMEA (Propylene glycol methyl ether acetate), PGME (propylene glycol monomethyl ether), PGEE(1-Ethoxy-2-propanol), GBL(Gamma-Butyrolactone), CHN(Cyclohexanone), EL(Ethyl lactate), Methanol, Ethanol, Propanol, n-Butanol, Acetone, DMF(Dimethylformamide), IPA (Isopropyl alcohol), THF (Tetrahydrofuran), Methyl Isobutyl Carbinol (MIBC), nBA (n-butyl acetate), MAK(2-heptanone), Isobutyl propionate, etc.

In some embodiments, the metallic photoresist material is constructed by, or from, a major solvent. In some embodiments, the major solvent may include PGMEA (Propylene glycol methyl ether acetate), PGME (propylene glycol monomethyl ether), PGEE (1-Ethoxy-2-propanol), GBL (Gamma-Butyrolactone), CHN (Cyclohexanone), EL (Ethyl lactate), Methanol, Ethanol, Propanol, n-Butanol, Acetone, DMF (Dimethylformamide), IPA (Isopropyl alcohol), THF (Tetrahydrofuran), Methyl Isobutyl Carbinol (MIBC), nBA (n-butyl acetate), MAK (2-heptanone), etc.

Figure 4:
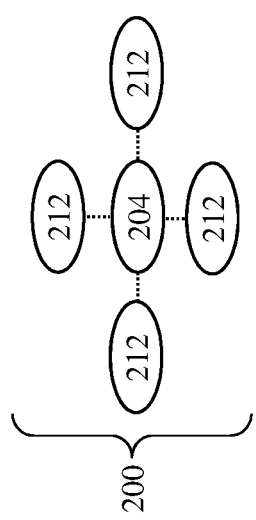
FIG. 4 is a diagram showing a structure of a photoresist in accordance with some embodiments of the present disclosure.

Referring now to FIG. 4, in some embodiments, the metallic resist material of the photoresist layer 160 has a structure 200. The structure 200 may be a particle (e.g., a cluster) that includes a core group 204 surrounded by multiple ligands 212. In the embodiment illustrated in FIG. 4, the dotted lines indicate ionic, covalent, metallic, or van der Waals bonds between the core group 204 and the ligands 212. In many embodiments, the core group 204 includes at least one metallic element in the form of a pure metal (i.e., a metal atom), a metallic ion, a metal compound (e.g., a metal oxide, a metal nitride, a metal oxynitride, a metal silicide, a metal carbide, etc.), a metal alloy (e.g., a combination of multiple metallic elements), or a combination thereof. In some embodiments, the core group 204 includes one or more metallic elements with a high EUV absorption. For example, the metallic elements of the core group 204 may be selected from the following: Caesium (Cs), Barium (Ba), Lanthanum (La), Cerium (Ce), Indium (In), Tin (Sn), Silver (Ag), Antimony (Sb), or other suitable elements. In some embodiments, the core group 204 may be about 0.5%-7% of the major solvent (e.g., PGMEA, PGME, PGEE, etc.) by weight.

The ligands 212 may be connected with the core group 204 to protect the core group 204 from condensation before the exposure process of the EUV lithography occurs. The ligands 212 may be cleaved from the core group 204 after the exposure process, or they may be cleaved using heat treatment. The ligands 212 may be the same or different from one another. In some embodiments, the ligands may include a low-activation-energy type ligand. In other embodiments, the ligands may include a high-developer-solubility type ligand. According to aspects of the present disclosure, the core group 204 may have either type of the ligands attached thereto, or both types of ligands attached thereto. For example, a first subset of metal atoms/ions of the core group 204 may each be attached to a low-activation-energy type ligand, while a second subset (different from the first subset) of metal atoms/ions of the core group 204 may each be attached to a high-developer-solubility type ligand. Each of these types of ligands will now be discussed in more detail below.

Figure 5:
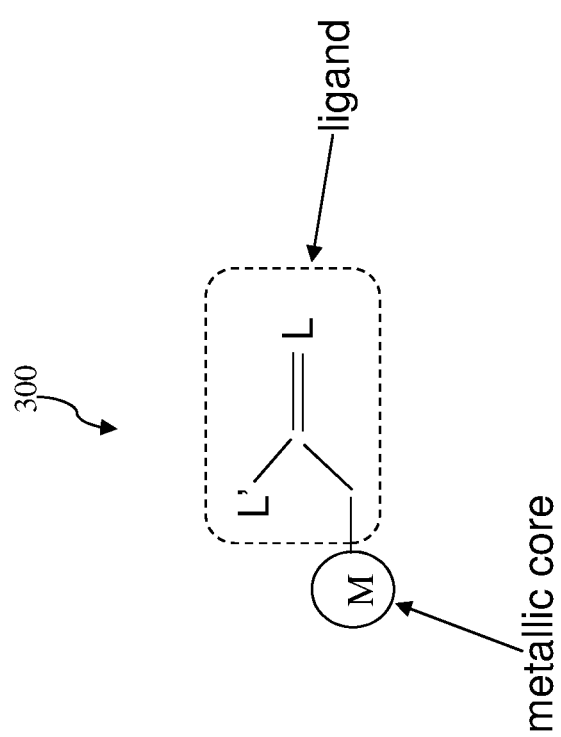
FIGS. 5-9 illustrate the chemical formulas portions of the photoresist according to embodiments of the present disclosure.
Figure 6:
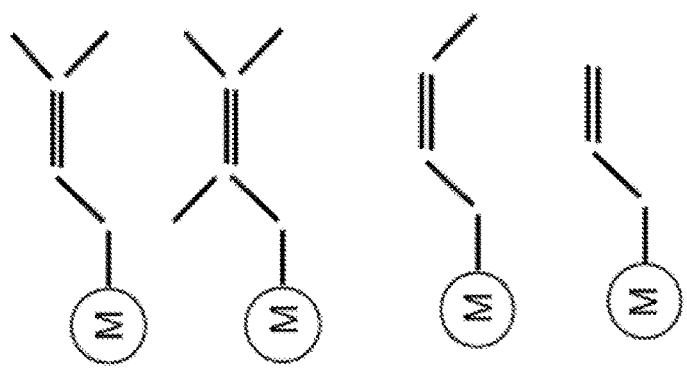
Figure 6:
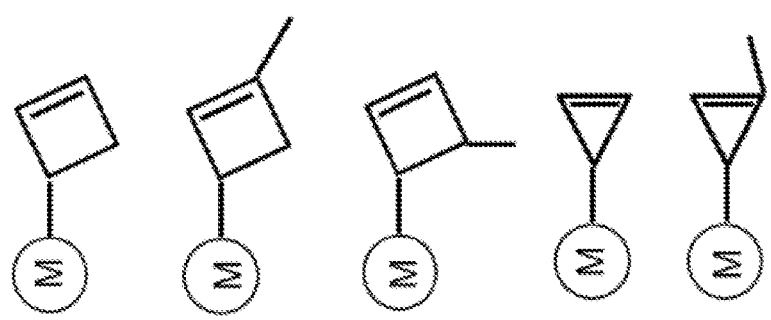
Figure 6:
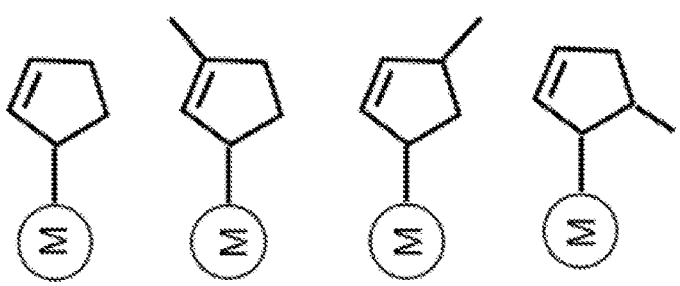
Figure 6:
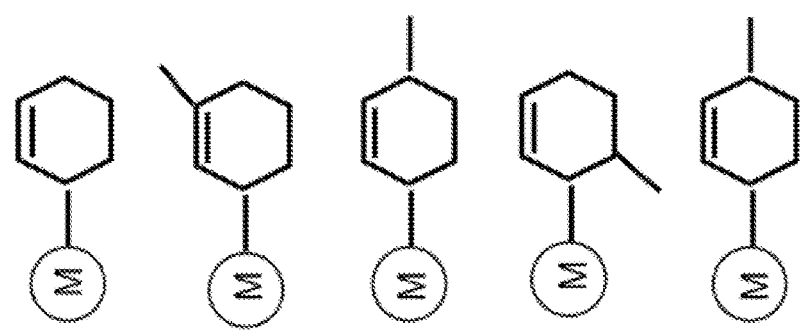
Figure 7:
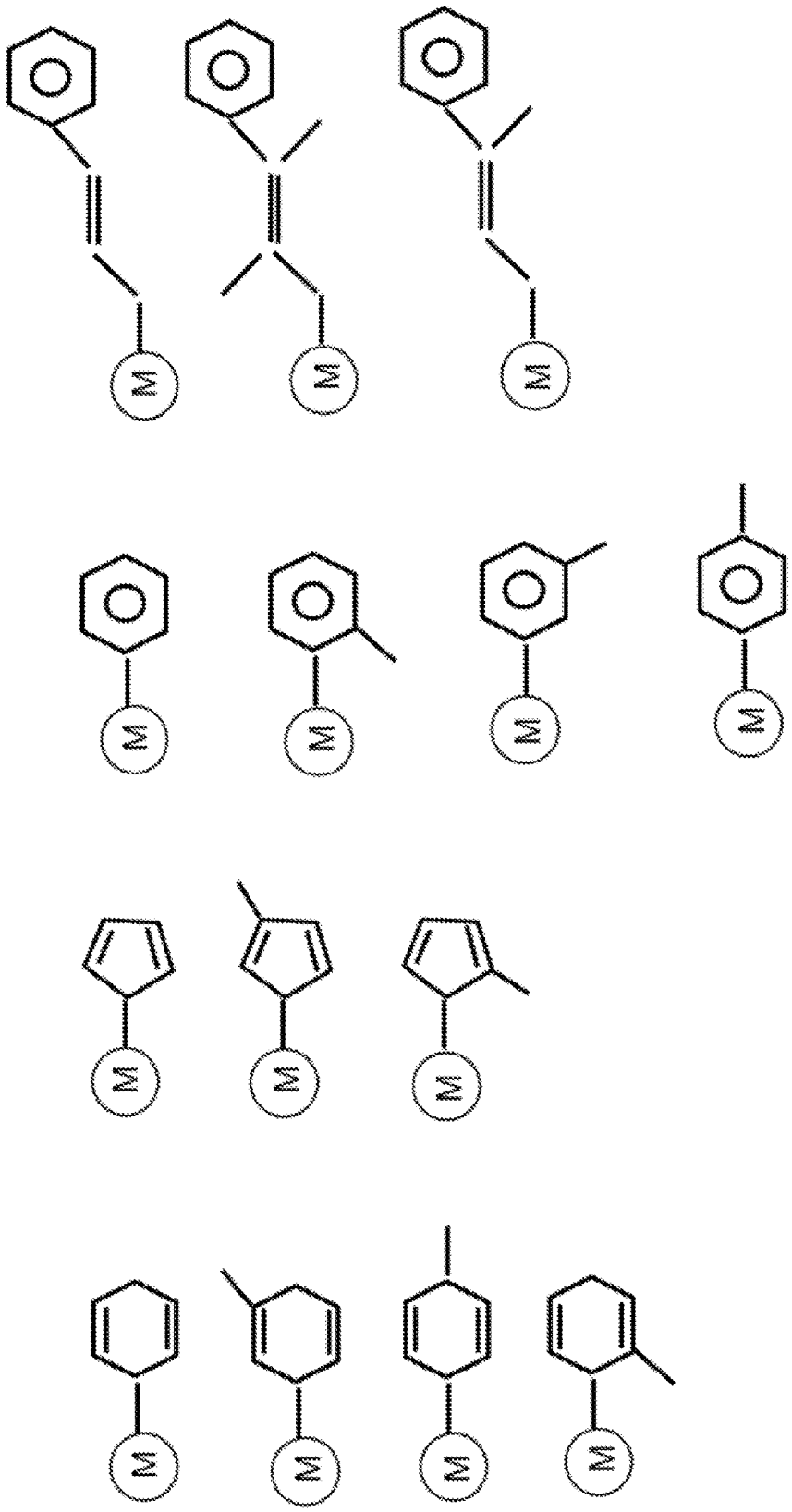

A general chemical structure 300 of the low-activation-energy type ligand is shown below and also illustrated in FIG. 5.

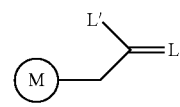

The chemical structure 300 includes a metallic core (represented by M surrounded by a circle), which may be an embodiment of the core group 204 discussed above with reference to FIG. 4. For example, the core group may include N number of metal ions such as Sn ions. In some embodiment, N is in a range between about 1 and about 18. The rest of the chemical structure 300 (e.g., other than the metallic core) corresponds to the low-activation-energy type ligand, which may be represented by a chemical L' and a chemical L that are linked together. In some embodiments, the chemical L' includes 0-2 carbon atoms that may be saturated by hydrogen (H) or fluorine (F). In some embodiments, the chemical L may have an unbranched or branched structure, or a cyclic or non-cyclic structure, with 1-6 carbon atoms that may be saturated by H or F. Some example chemical formulas for the low-activation-energy ligand (e.g., including both L' and L) are listed below and shown in FIGS. 6-7.

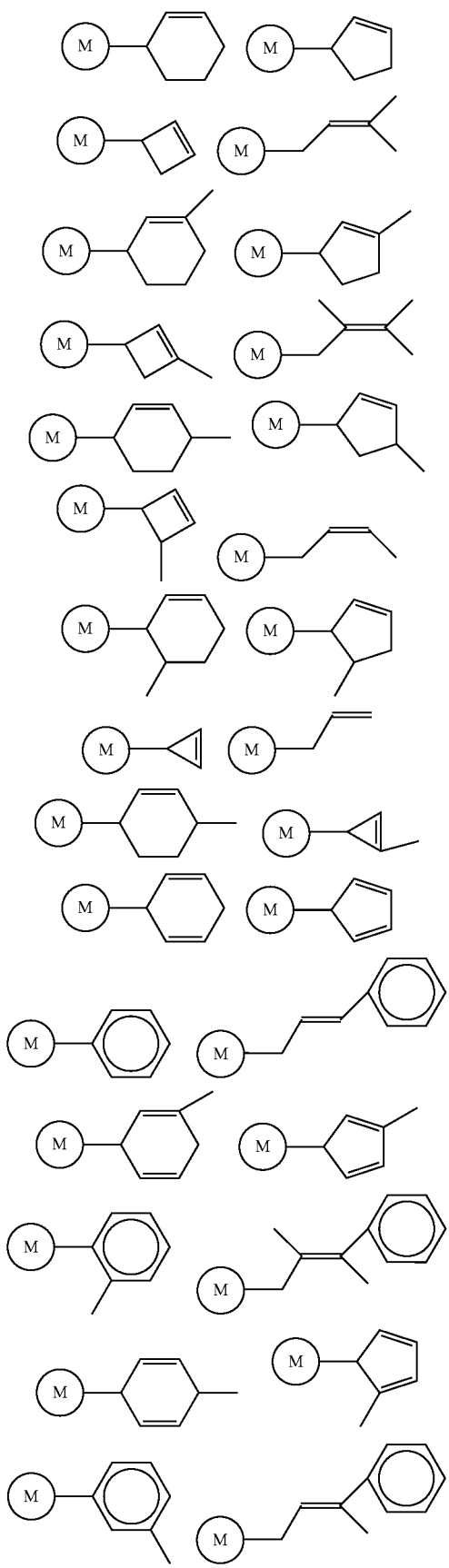

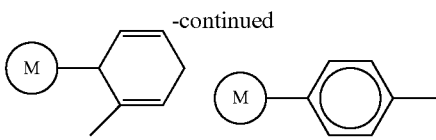

Compared to conventional EUV photoresists, the EUV photoresist of the present disclosure may implement the low-activation-energy type of ligands as discussed above. This is advantageous, because the low-activation-energy ligands allow a lower exposure dose to be used than what was used in conventional EUV lithography. For example, when EUV photoresist undergoes exposure, a number of the ligands may break the link or bond with the metallic core. The amount of energy needed to cause such a break may be referred to as activation energy. Whereas conventional EUV photoresist may need an $X_1$ amount of activation energy, the ligands herein allow the amount of activation energy to be reduced to $X_2$, where $X_2$ is lower than $X_1$. Hence, a smaller exposure dose or smaller exposure energy may now be used to perform EUV lithography. In other words, the low-activation-energy ligands of the present disclosure improves the photon absorption. In some embodiments, the exposure energy may be improved by 3-40%. Or stated differently, the exposure energy used to expose the EUV photoresist herein may be 3-40% smaller than the exposure energy used to expose conventional EUV photoresists.

Figure 8:
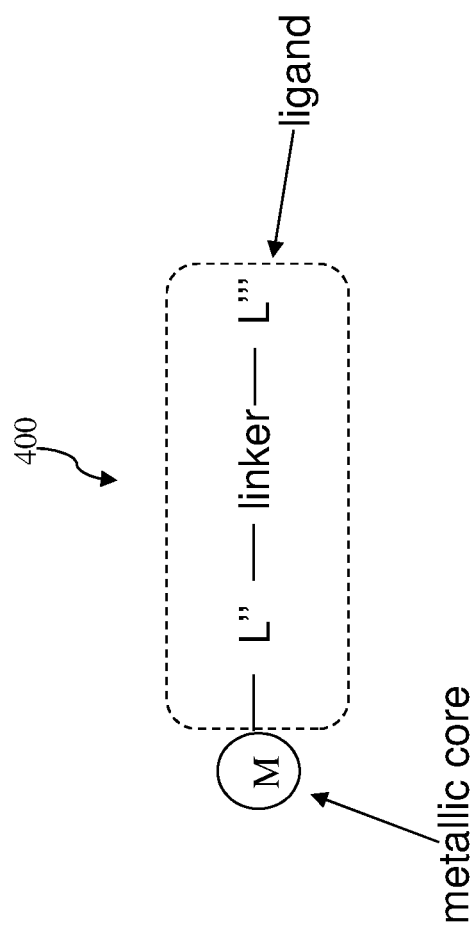
Figure 9:
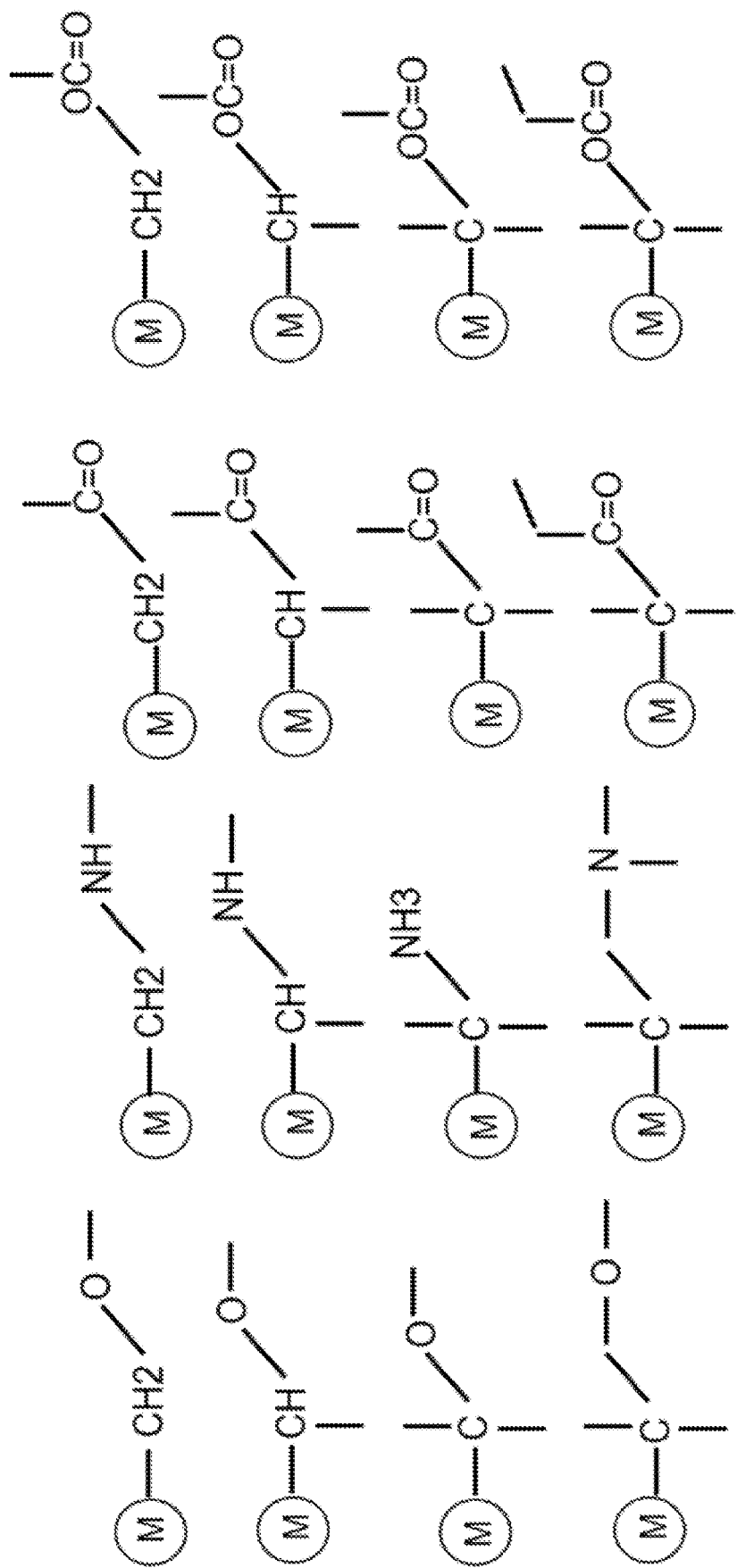

A general chemical structure 400 of the high-developer-solubility type ligand is shown below and also illustrated in FIG. 8.

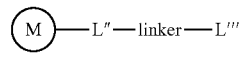

The chemical structure 400 includes a metallic core (M surrounded by a circle), which also may be an embodiment of the core group 204 discussed above with reference to FIG. 4. For example, the core group may include N number of metal ions such as Sn ions. In some embodiment, N is in a range between about 1 and about 18. The rest of the chemical structure 300 (e.g., other than the metallic core) corresponds to the low-activation-energy type ligand, which may be represented by a chemical L" and a chemical L''' that are linked together by a linker unit. In some embodiments, the chemical L" includes 1-6 carbon atoms that may be saturated by hydrogen (H). In some embodiments, the chemical L''' may have an unbranched or branched structure, or a cyclic or non-cyclic structure, with 1-6 carbon atoms that may be saturated by H or F. The linked unit is connected between the chemicals L" and L''' and may include: C=O, —S—, —P—, —P(O$_2$)—, —C(=O)SH, —C(=O)OH, —OC(=O)—, —O—, —N—, —NH—, —NH$_2$—, —C(=O)NH, —SO$_2$OH, —SO$_2$SH, —SO—, or —SO$_2$. Some example chemical formulas for the low-activation-energy ligand (e.g., including L", L''', and the linker unit) are listed below and shown in FIG. 9.

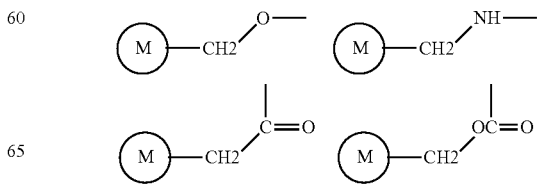

-continued

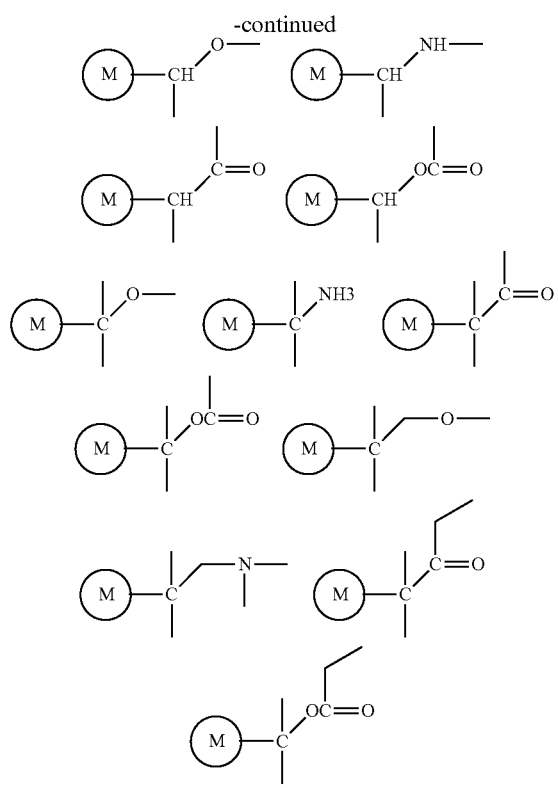

Compared to conventional EUV photoresists, the EUV photoresist of the present disclosure may implement the high-developer solubility type of ligands as discussed above. This is advantageous, because the high-developer-solubility ligands are more easily rinsed away by the developer solution in the photoresist developing process. As a result, line-width-roughness (LWR) may be improved without needing a stronger exposure dose. In other words, the high-developer-solubility ligands of the present disclosure improves the lithography performance, such as improved LWR. In some embodiments, the LWR may be improved by 3-30%. Or stated differently, the LWR of patterns achieved using the EUV photoresist herein may be 3-30% better than the LWR of patterns achieved using conventional EUV photoresists.

Due to the implementation of the low-activation-energy ligands and/or the high-developer-solubility ligands, the EUV photoresist of the present disclosure is well suited for advanced EUV lithography processes. For example, it may be used in processes where the pitch of less than about 40 nanometers (n) needs to be achieved. In various embodiments, the EUV photoresist herein may be used in the 10 nm technology node, the 7 nm technology node, the 5 nm technology node, or the 3 nm technology node and beyond.

Referring now to FIG. 10, a developing process 500 is performed to pattern the photoresist layer 160. In some embodiments, the exposed portions of the photoresist layer 160 will remain after the developing process 500 has been performed, while unexposed portions of the photoresist layer 160 are washed away. As discussed above, the developer solution used in the developing process 500 may include: PGMEA, PGME, PGEE, GBL, CHN, EL, Methanol, Ethanol, Propanol, n-Butanol, Acetone, DMF, IPA, THF, MIBC, nBA, MAK, Isobutyl propionate, etc. Since the photoresist layer 160 may contain the high-developer-solubility ligands, the unexposed regions of the photoresist layer 160 are more easily removed using the developer solution. As a result, LWR may be improved, as discussed above.

In any case, the pattern photoresist layer 160 now includes the remaining portions of the photoresist layer 160 separated by openings 510. The patterned photoresist layer 160 can now be used to pattern the material layer 150 therebelow in subsequent fabrication processes. In some embodiments, a lateral dimension 530 of the openings 510 may define the critical dimension (CD) of features of the semiconductor device 100. In other embodiments, a lateral dimension 540 of a component of the patterned photoresist layer 160 may define the CD of features of the semiconductor device 100.

Referring now to FIG. 11, a patterning process 600 is performed to pattern the material layer 150. The photoresist layer 160 serves as a mask for patterning the material layer 150. The dimensions 530 and 540 are transferred to the material layer 150. As discussed above, the ligands of the metallic photoresist layer 160 allows the CD control to be tighter (e.g., achieving smaller CD variations). For example, the low-activation-energy ligands allow lower activation energy to be used and improves photon absorption efficiency. The high-developer-solubility ligands improves the LWR of the patterned photoresist layer 160 and in turn the LWR of the patterned material layer 150. As a result, the dimensions 530 and 540 (i.e., the CDs) may be better controlled.

Figure 12:
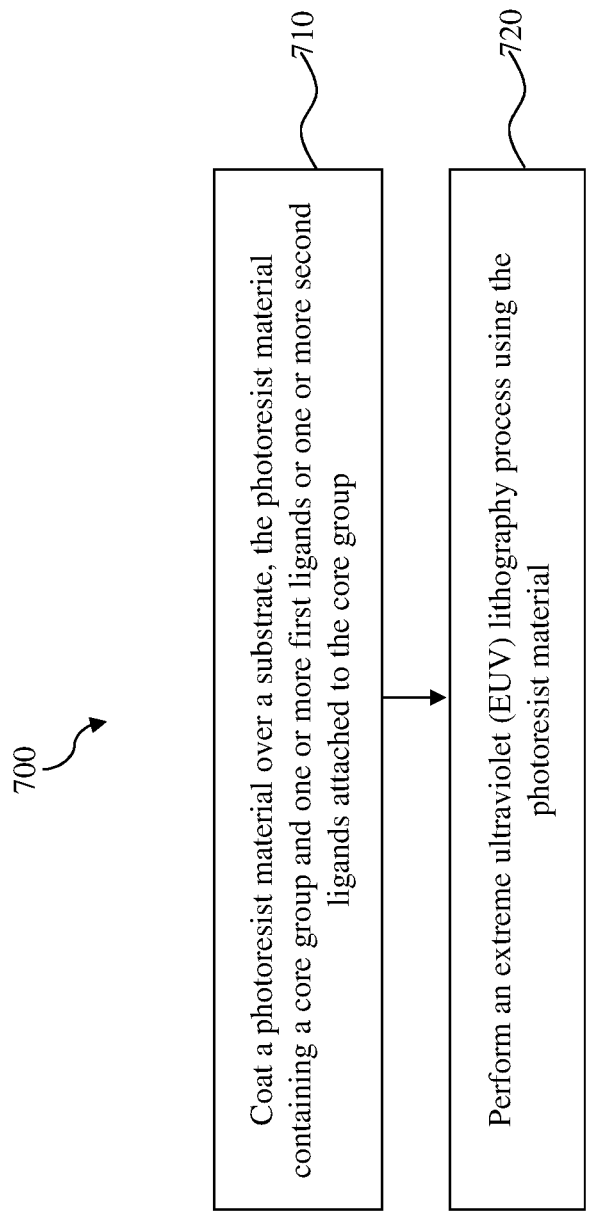
FIG. 12 is a flowchart of a method of fabricating a semiconductor device in accordance with some embodiments of the present disclosure.

FIG. 12 is a flowchart illustrating a simplified method 700 of fabricating a semiconductor device. The method 700 includes a step 710 to coat a photoresist material over a substrate. The photoresist material contains a core group and one or more first ligands or one or more second ligands attached to the core group. The method 700 includes a step 720 to perform an extreme ultraviolet (EUV) lithography process using the photoresist material. The core group contains metal.

A chemical structure of the first ligands includes:

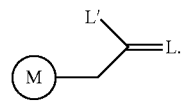

and a chemical structure of the second ligands includes:

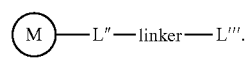

(M) represents the core group. L' represents a chemical that includes 0-2 carbon atoms saturated by Hydrogen (H) or Fluorine (F). L represents a chemical that includes 1-6 carbon atoms saturated by H or F. L" represents a chemical that includes 1-6 carbon atoms saturated by H. L'" represents a chemical that includes 1-6 carbon atoms saturated by H or F. Linker represents a chemical that links L" and L'" together.

In some embodiments, the method 700 further includes a step to construct the photoresist material using a solvent that is selected from the group consisting of: PGMEA (Propylene glycol methyl ether acetate), PGME (propylene glycol monomethyl ether), PGEE (1-Ethoxy-2-propanol), GBL (Gamma-Butyrolactone), CHN (Cyclohexanone), EL (Ethyl lactate), Methanol, Ethanol, Propanol, n-Butanol, Acetone, DMF (Dimethylformamide), IPA (Isopropyl alcohol), THF (Tetrahydrofuran), Methyl Isobutyl Carbinol (MIBC), nBA (n-butyl acetate), MAK (2-heptanone).

In some embodiments, the step 720 comprises performing a developing process using a developer that is selected from the group consisting of: PGMEA (Propylene glycol methyl ether acetate), PGME (propylene glycol monomethyl ether), PGEE (1-Ethoxy-2-propanol), GBL (Gamma-Butyrolactone), CHN (Cyclohexanone), EL (Ethyl lactate), Methanol, Ethanol, Propanol, n-Butanol, Acetone, DMF (Dimethylformamide), IPA (Isopropyl alcohol), THF (Tetrahydrofuran), Methyl Isobutyl Carbinol (MIBC), nBA (n-butyl acetate), MAK (2-heptanone).

In some embodiments, the core group contains Caesium (Cs), Barium (Ba), Lanthanum (La), Cerium (Ce), Indium (In), Tin (Sn), Silver (Ag), or Antimony (Sb).

In some embodiments, the linker includes: C=O, —S—, —P—, —P(O2)—, —C(=O)SH, —C(=O)OH, —OC(=O)—, —O—, —N—, —NH—, —NH2—, —C(=O)NH, —SO2OH, —SO2SH, —SO—, or —SO2.

In some embodiments, the core group includes a plurality of metal ions. A first subset of the metal ions each has a first ligand attached thereto. A second subset of the metal ions each has a second ligand attached thereto.

In some embodiments, the one or more first ligands are attached to the core group according to chemical formulas selected from the group consisting of:

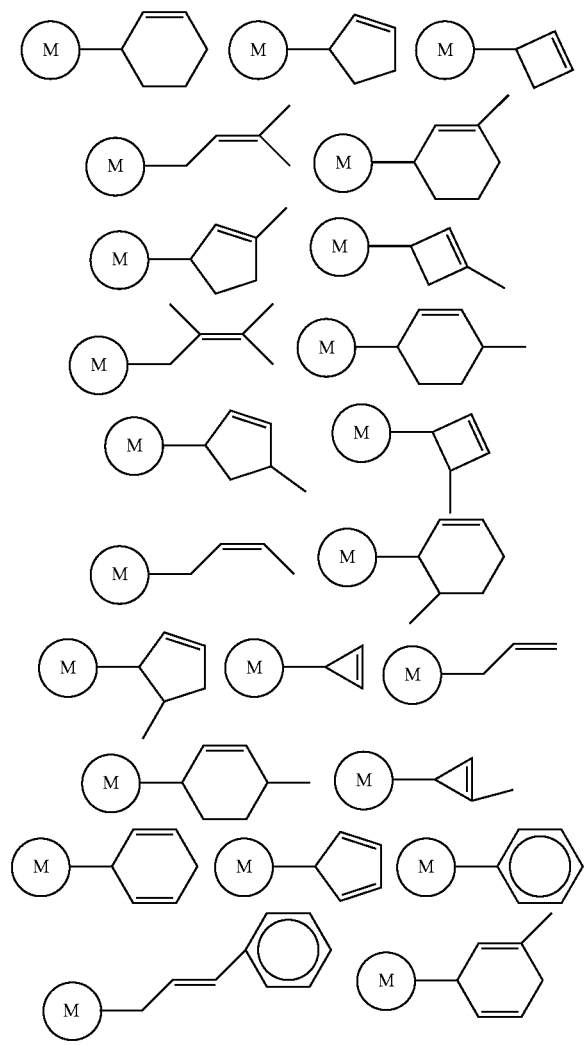

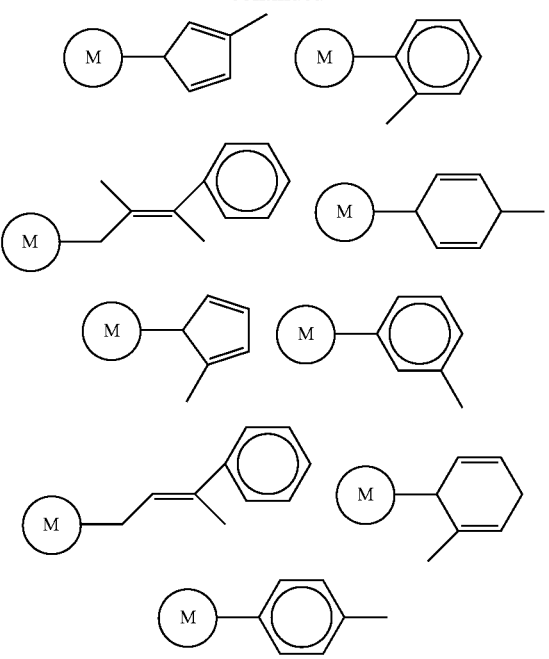

In some embodiments, the one or more second ligands are attached to the core group according to chemical formulas selected from the group consisting of:

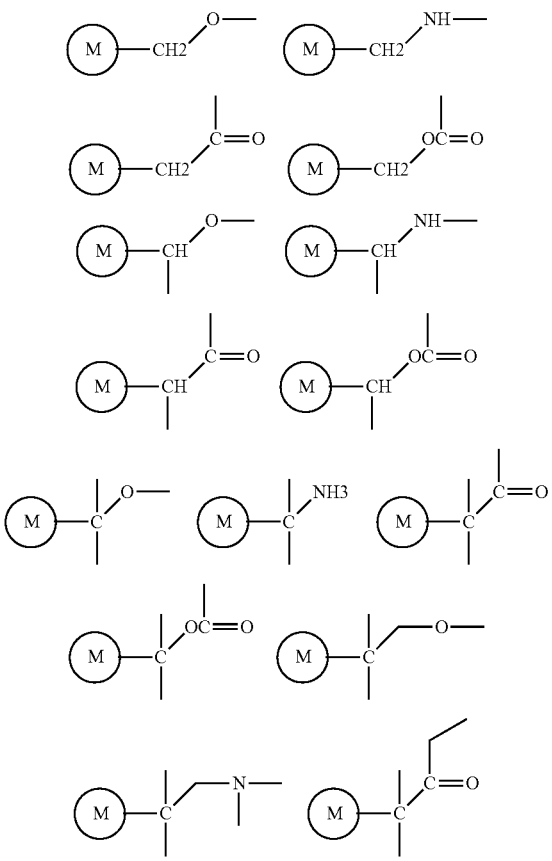

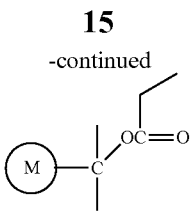

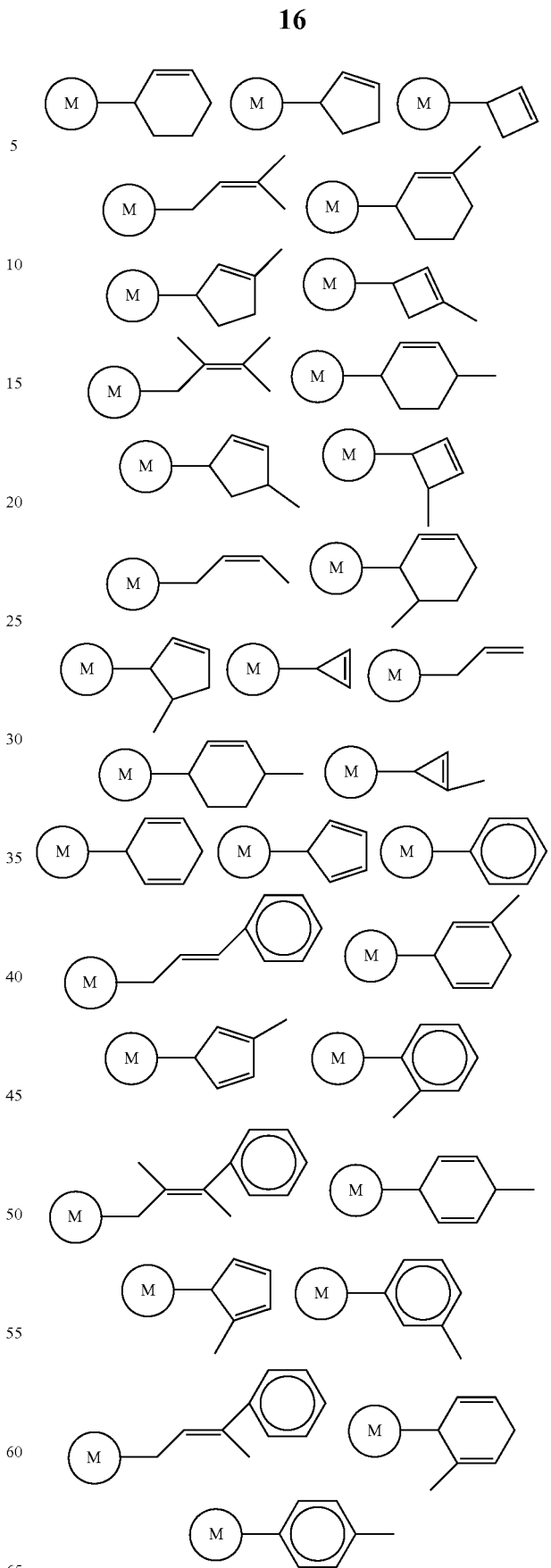

It is understood that additional fabrication processes may be performed before, during, or after the steps 710-720 of FIG. 12. For example, the method 700 may include a step of patterning other layers formed on the substrate using the photoresist material.

Based on the above discussions, it can be seen that the present disclosure offers various advantages in EUV lithography. It is understood, however, that not all advantages are necessarily discussed herein, and other embodiments may offer different advantages, and that no particular advantage is required for all embodiments. One of the advantages is better photon absorption. For example, the low-activation-energy ligands allow a lower activation energy to cleave the link/bond between the metal core group and the ligands. Thus, a smaller exposure dose or exposure energy may be used. Another advantage is better line-width-roughness. For example, the high-developer-solubility ligands are more easily dissolved in the developer solution. As such, the portions of the photoresist that should be removed as a part of the developing process are more easily washed away, which helps improve the line-width-roughness of the resulting photoresist pattern (and the layers to be patterned using the photoresist pattern). Another advantage is that the processes discussed herein are compatible with existing fabrication process flow and are easy to implement.

One aspect of the present disclosure pertains to a photoresist. The photoresist includes a core group that contains metal, and one or more first ligands or one or more second ligands attached to the core group. The first ligands each have a following structure:

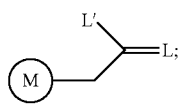

The second ligands each have a following structure:

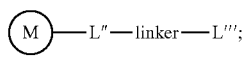

(M) represents the core group. L' represents a chemical that includes 0-2 carbon atoms saturated by Hydrogen (H) or Fluorine (F). L represents a chemical that includes 1-6 carbon atoms saturated by H or F. L" represents a chemical that includes 1-6 carbon atoms saturated by H. L'" represents a chemical that includes 1-6 carbon atoms saturated by H or F. Linker represents a chemical that links L" and L'" together.

One aspect of the present disclosure pertains to a photoresist. The photoresist includes a core group that contains metal. The photoresist includes a first ligand or a second ligand attached to the core group. The first ligand has one of the following chemical formulas:

The second ligand has one of the following chemical formulas:

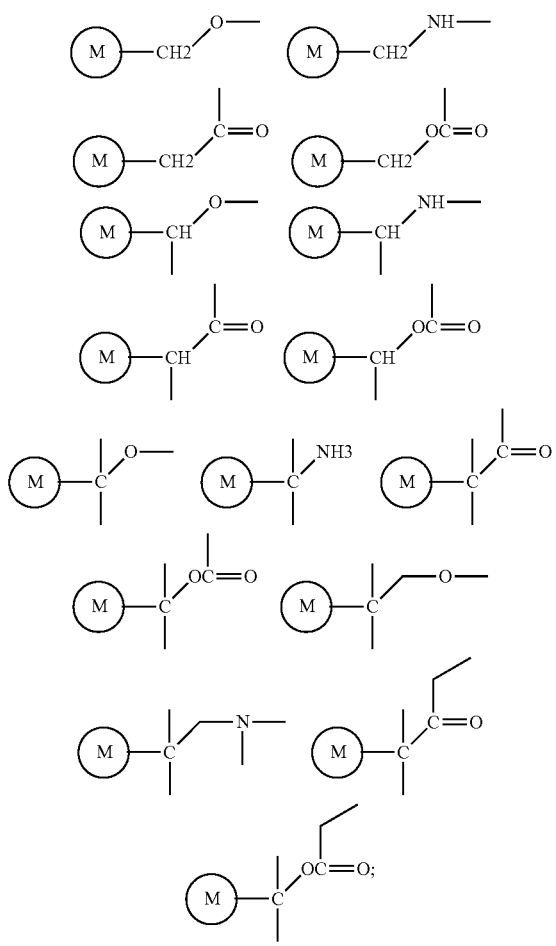

In some embodiments, the photoresist is an extreme ultraviolet (EUV) photoresist.

Yet another aspect of the present disclosure pertains to a method. The method includes coating a photoresist material over a substrate. The photoresist material contains a core group and one or more first ligands or one or more second ligands attached to the core group. The method includes performing an extreme ultraviolet (EUV) lithography process using the photoresist material. The core group contains metal. A chemical structure of the first ligands includes:

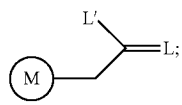

A chemical structure of the second ligands includes:

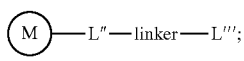

(M) represents the core group. L' represents a chemical that includes 0-2 carbon atoms saturated by Hydrogen (H) or Fluorine (F). L represents a chemical that includes 1-6 carbon atoms saturated by H or F. L" represents a chemical that includes 1-6 carbon atoms saturated by H. L'" represents a chemical that includes 1-6 carbon atoms saturated by H or F. Linker represents a chemical that links L" and L'" together.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photoresist, comprising:
   a metal-containing component; and
   one or more ligands coupled to the metal-containing component;
   wherein each ligand in a subset of the one or more ligands includes:
   a first chemical coupled to the metal-containing component, wherein the first chemical includes carbon and hydrogen;
   a second chemical that includes carbon, wherein the second chemical further includes hydrogen or fluorine; and
   a linker that is linked to both the first chemical and the second chemical, wherein the linker includes:
   a first compound that contains —C(=O)SH; or
   a second compound that contains —SO$_2$OH, or —SO$_2$SH.

2. The photoresist of claim 1, wherein the metal-containing component contains Caesium (Cs), Barium (Ba), Lanthanum (La), Cerium (Ce), Indium (In), Silver (Ag), or Antimony (Sb).

3. The photoresist of claim 1, wherein the photoresist is an extreme ultraviolet (EUV) lithography photoresist.

4. The photoresist of claim 1, wherein:
   the subset of the one or more ligands is a first subset of the ligands;
   the one or more ligands further includes a second subset;
   each ligand in the second subset of the ligands includes the first chemical and the second chemical; and
   the first chemical and the second chemical are coupled together without the linker.

5. The photoresist of claim 4, wherein the metal-containing component is simultaneously attached to a first ligand from the first subset and a second ligand from the second subset.

6. The photoresist of claim 5, wherein:
   the metal-containing component includes a first metal ion and a second metal ion;
   the first ligand is attached directly to the first metal ion; and
   the second ligand is attached directly to the second metal ion.

7. The photoresist of claim 4, wherein the ligands in the first subset have one of the following chemical formulas:

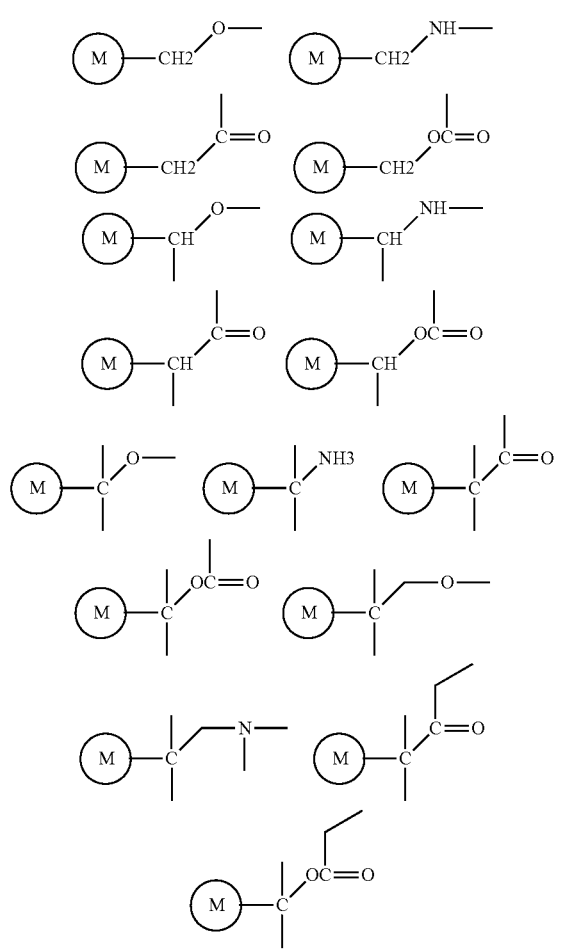

wherein Ⓜ represents the metal-containing component.

8. The photoresist of claim 4, wherein the ligands in the second subset have one of the following chemical formulas:

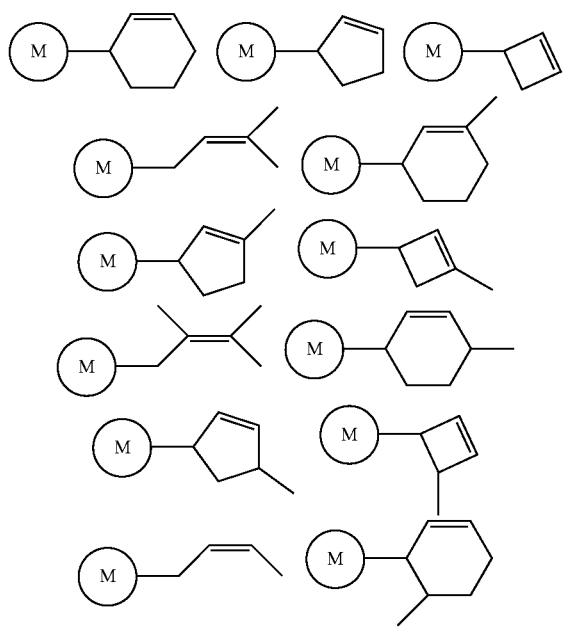

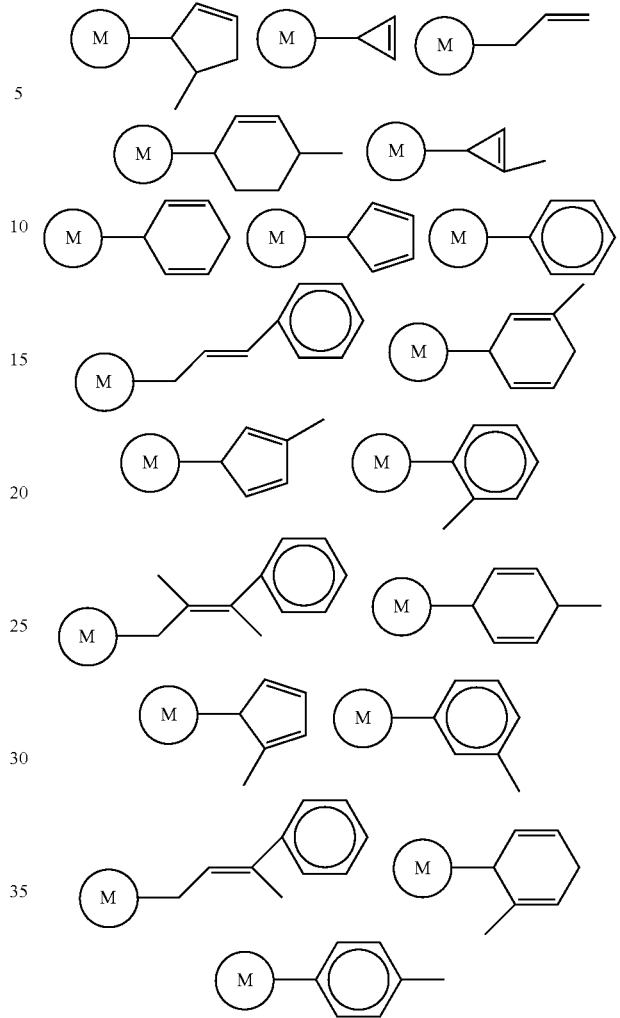

wherein Ⓜ represents the metal-containing component.

9. A photoresist, comprising
a metal-containing component;
one or more ligands attached to the metal-containing component;
wherein each ligand in a subset of the one or more ligands has one of the following chemical formulas:

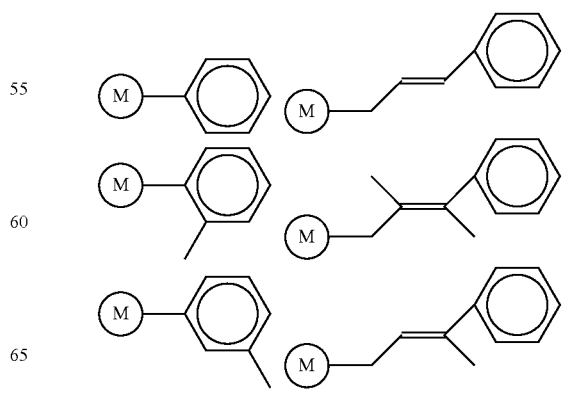

-continued

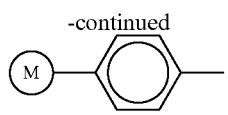

wherein represents the metal-containing component; and
a linker that includes:
  a first compound that contains —C(=O)SH: or
  a second compound that contains —SO$_2$OH, or —SO$_2$SH.

10. The photoresist of claim 9, wherein: the metal-containing component contains Caesium (Cs), Barium (Ba), Lanthanum (La), Cerium (Ce), Indium (In), Tin (Sn), Silver (Ag), or Antimony (Sb).

11. The photoresist of claim 9, wherein:
the metal-containing component contains a plurality of metal ions;
the one or more ligands belong to a first subset of ligands that are attached to a first one of the metal ions;
the photoresist further includes a second subset of ligands that are attached to a second one of the metal ions; and
the second subset of ligands each have one of the following chemical formulas:

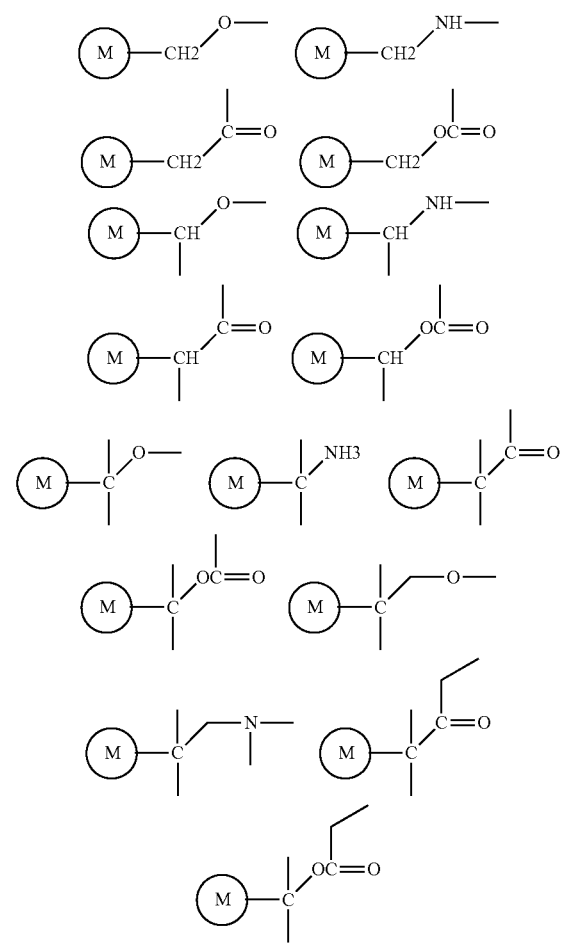

12. The photoresist of claim 9, wherein the photoresist is an extreme ultraviolet (EUV) lithography photoresist.

13. A method, comprising:
forming a photoresist material over a substrate, wherein the photoresist material contains a metal-containing component and one or more ligands coupled to the metal-containing component; and
performing an extreme ultraviolet (EUV) lithography process using the photoresist material;
wherein each ligand in a subset of the one or more ligands includes:
  a first chemical coupled to the metal-containing component, wherein the first chemical includes carbon and hydrogen;
  a second chemical that includes carbon, wherein the second chemical further includes hydrogen or fluorine; and
  a linker that is linked to both the first chemical and the second chemical, wherein the linker includes:
    a first compound that contains —C(=O)SH; or
    a second compound that contains —SO$_2$OH, or —SO$_2$SH.

14. The method of claim 13, wherein the metal-containing component contains Caesium (Cs), Barium (Ba), Lanthanum (La), Cerium (Ce), Indium (In), Silver (Ag), or Antimony (Sb).

15. The method of claim 13, wherein:
the subset of the one or more ligands is a first subset of the ligands;
the one or more ligands further includes a second subset;
each ligand in the second subset of the ligands includes the first chemical and the second chemical; and
the first chemical and the second chemical are coupled together without the linker.

16. The method of claim 15, wherein:
the metal-containing component is simultaneously attached to a first ligand from the first subset and a second ligand from the second subset;
the metal-containing component includes a first metal ion and a second metal ion;
the first ligand is attached directly to the first metal ion; and
the second ligand is attached directly to the second metal ion.

17. The method of claim 15, wherein the ligands in the first subset have one of the following chemical formulas:

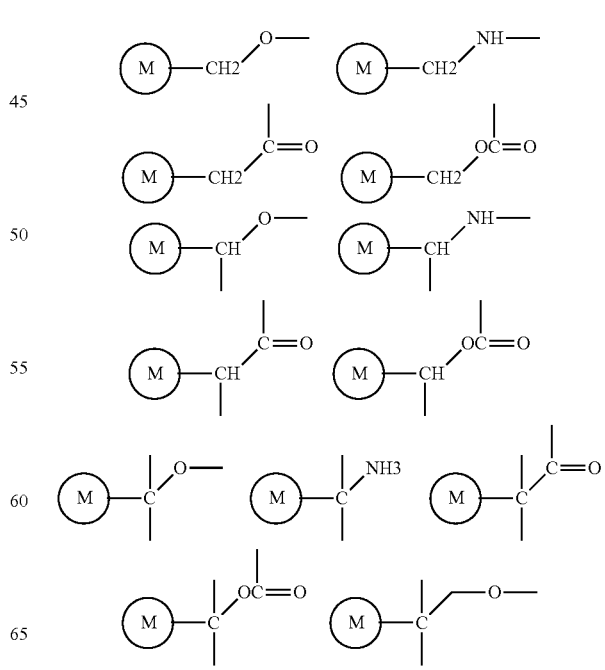

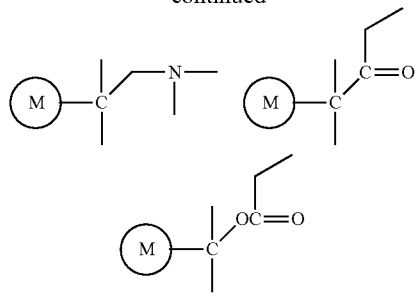

wherein Ⓜ represents the metal-containing component.

18. The method of claim 15, wherein the ligands in the second subset have one of the following chemical formulas:

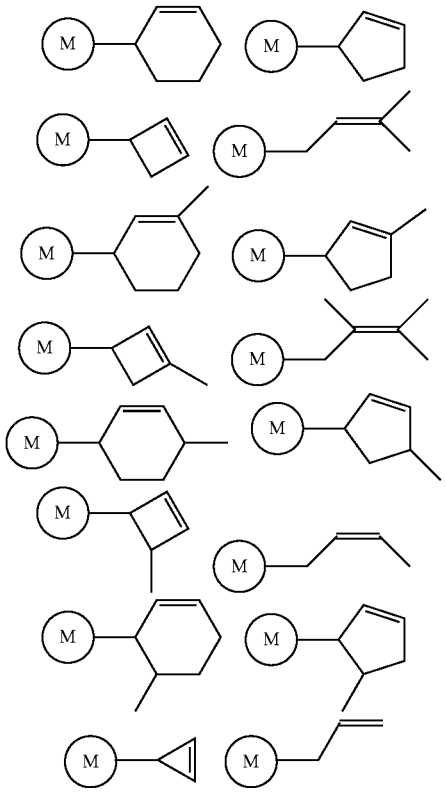

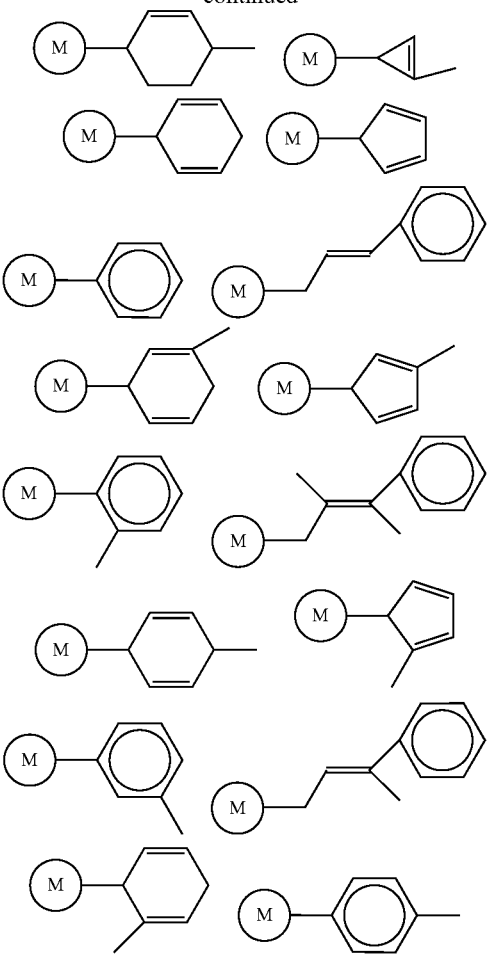

wherein Ⓜ represents the metal-containing component.

19. The method of claim 13, wherein the EUV process includes an exposure process, and wherein the one or more ligands are cleaved from the metal-containing component after the exposure process.

20. The method of claim 13, further comprising cleaving the one or more ligands from the metal-containing component at least in part via a heat treatment process.

* * * * *